(12) United States Patent
Cole, Jr. et al.

(10) Patent No.: US 6,252,304 B1
(45) Date of Patent: *Jun. 26, 2001

(54) METALLIZED VIAS WITH AND METHOD OF FABRICATION

(75) Inventors: Herbert Stanley Cole, Jr., Burnt Hills; Wolfgang Daum, Glenville, both of NY (US)

(73) Assignee: General Electric Company, Schenectady, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/221,967

(22) Filed: Dec. 28, 1998

Related U.S. Application Data

(62) Division of application No. 08/967,530, filed on Nov. 10, 1997, now Pat. No. 5,897,368.

(51) Int. Cl.$^7$ .................................................... H01L 23/48

(52) U.S. Cl. ........................................... 257/759; 760/762

(58) Field of Search ..................................... 257/759, 760, 257/762, 772, 748, 750; 438/118, 622, 625, 627, 629, 637

(56) References Cited

U.S. PATENT DOCUMENTS

| | | |
|---|---|---|
| 4,865,873 | 9/1989 | Cole, Jr. et al. . |
| 4,988,412 | 1/1991 | Liu et al. . |
| 4,999,251 | 3/1991 | Foust et al. . |
| 5,015,517 | 5/1991 | Walsh . |
| 5,230,965 | 7/1993 | Cole, Jr. et al. . |
| 5,287,619 | 2/1994 | Smith et al. . |
| 5,336,929 * | 8/1994 | Hayashi ................................ 257/772 |
| 5,567,657 * | 10/1996 | Wojnarowski et al. .............. 438/118 |
| 5,616,960 * | 4/1997 | Noda et al. ........................... 257/760 |
| 5,661,080 | 8/1997 | Hwang et al. . |
| 5,933,669 * | 7/1999 | Uzoh ..................................... 438/627 |
| 5,933,753 * | 8/1999 | Simon et al. ......................... 438/629 |

* cited by examiner

*Primary Examiner*—Olik Chaudhuri
*Assistant Examiner*—William David Coleman
(74) *Attorney, Agent, or Firm*—Ann M. Agosti; Jill M. Breedlove

(57) ABSTRACT

A method includes applying a first seed layer extending over a horizontal surface and via sidewalls of a dielectric material and exposed underlying contact metallization; removing at least some of the first seed layer from the contact metallization and the horizontal surface while leaving a sufficient amount of the first seed layer on the sidewalls as a catalyst for subsequent application of a third seed layer; sputtering a second seed layer over the contact metallization and the horizontal surface; using an electroless solution to react with the first seed layer and apply the third seed layer over the sidewalls; and electroplating an electroplated layer over the second and third seed layers.

7 Claims, 4 Drawing Sheets

METALLIZED VIAS WITH AND METHOD OF FABRICATION

This application is a division of Ser. No. 08/967,530 Nov. 10, 1997 now U.S. Pat. No. 5,897,368.

BACKGROUND OF THE INVENTION

The present invention relates to interconnect metallization overlying a polymer layer and extending through vias in the polymer layer to underlying contact metallization.

High density interconnect (HDI) is a high performance chip packaging technology wherein sequential layers of metallization on polymer are used to interconnect chip pads with high chip density. In one form of HDI circuit module, an adhesive-coated polymer film overlay having via openings covers a plurality of integrated circuit chips in chip wells on an underlying substrate. The polymer film provides an insulated layer upon which is deposited a metallization pattern for interconnection of individual circuit chips through the vias. Methods for performing a HDI process using overlays are further described in Eichelberger et al., U.S. Pat. No. 4,783,695, issued Nov. 8, 1988, and in Eichelberger et al., U.S. Pat. No. 4,933,042, issued Jun. 12, 1990. The polymer layer may comprise electrically insulating material upon which an electrically conductive material can adhere such as, for example, a polyimide.

Vias extending through the polymer layer to chip pads can be formed by any appropriate process. A preferred method of laser-drilling vias in the polymer film is described in Eichelberger et al., U.S. Pat. No. 4,894,115, issued Jan. 16, 1990. Conventional interconnect metallization processes generally use an argon ion laser to drill vias to chip pads or other types of contact metallization. Typical via depths are about thirty (30) to about forty (40) micrometers, and typical via sidewalls are sloped out and upwards from their horizontal bottom surfaces on the order of about forty-five degrees (45°) to about sixty degrees (60°). After via drilling, residual debris is removed by plasma ashing or reactive ion etching (RIE) treatment. The via surfaces can then be backsputtered to remove any oxide on the underlying metallization. A thin seed layer of titanium (about 1000 angstroms) is sputtered, and a thin layer of copper (about 3000 angstroms) is sputtered. These layers provide a thin conducting layer capable of serving as a ground plane for subsequent electrodeposition of copper. In one embodiment, copper is plated to a thickness of about four (4) micrometers, and another thin layer of titanium is then sputtered over the plated copper. The metallization layers (titanium, copper, copper, and titanium) are patterned using photoresist processing steps. Additional polymer layers can be applied with the via and via metallization process being repeated for each layer to complete the electrical circuit module.

Good coverage of the sputtered metal layers has been achieved using conventional methods because the sidewalls of the vias are sufficiently sloped. This technique, however, imposes limitations on the resolution capability for thicker polymer layers. For example, if a polymer layer is in the thickness range of fifty (50) to seventy-five (75) micrometers, if a slope of about forty-five degrees (45°) to about sixty degrees (60°) is to be used, the diameter of the hole at the top of the via will be significantly larger (twice as large) as the diameter for a dielectric layer having a thickness of thirty-five (35) micrometers, and the vias will thus require larger metal cover pads (areas of metallization in and around the vias).

Using current designs, vias often have twenty five micrometer (one mil) diameters at their narrowest sections and rectangular cover pads of about sixty-five micrometers per side. These dimensions cannot be achieved with thicker dielectric layers having the same sloped sidewalls, and interconnect density would thus be reduced for thicker polymer layers. Reductions in density lead to requirements for additional layers.

If steeper sidewalls (sidewalls with increasing slopes) are used, yield and reliability issues associated with metal coverage arise. Because sputtering is primarily directional, little or no metal is sputtered on very steep sidewalls of a polymer layer. Incomplete coverage of sputtered metal does not support subsequent electrodeposition processing, and metallized vias are formed with gaps in the metallization that can have high resistance values or create open circuits.

SUMMARY OF THE INVENTION

Thus there is a particular need for a method to insure high yield metal interconnect through deep vias with steep sidewalls, and, more specifically, there is a need for a method to plate electrolytic copper in vias with vertical or recessed sidewalls.

Briefly, according to one embodiment of the present invention, a method for metallizing steep-walled vias extending through dielectric material to contact metallization comprises applying a first seed layer extending over the contact metallization and over a horizontal surface and via sidewalls of the dielectric material; removing at least some of the first seed layer from the contact metallization and the horizontal surface of the dielectric material while leaving a sufficient amount of the first seed layer on the via sidewalls as a catalyst for subsequent application of a third seed layer on the sidewalls; sputtering a second seed layer over the contact metallization and the horizontal surface of the dielectric material; using an electroless solution to react with the first seed layer and apply the third seed layer over the sidewalls; and electroplating an electroplated layer over the second and third seed layers.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
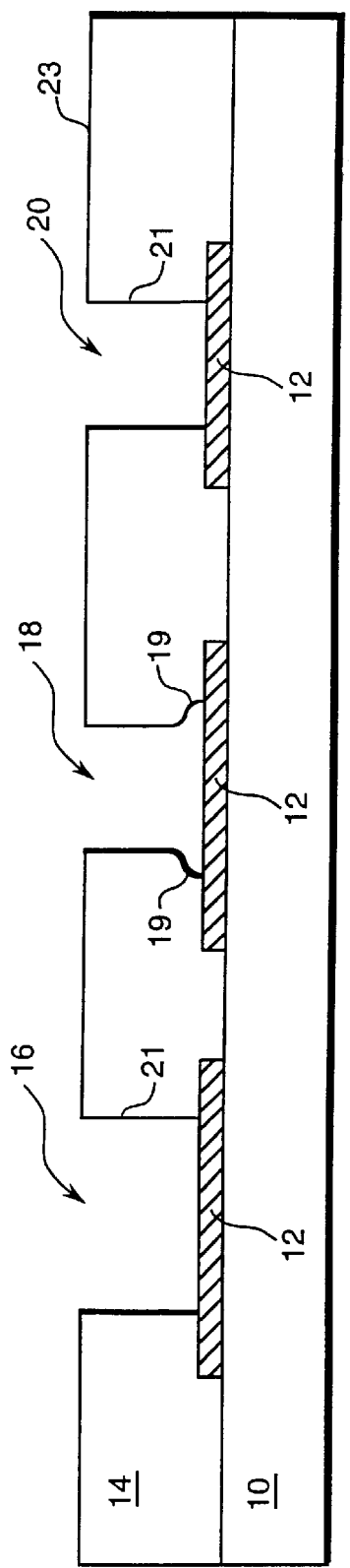
FIG. 1 is a sectional side view of a dielectric material with vias therethrough overlying a support layer having contact metallization.

FIG. 1 is a sectional side view of a dielectric material 14 overlying a support layer 10 having contact metallization 12.

Support layer 10 may comprise any structurally suitable material capable of supporting contact metallization 12. Examples of appropriate support layers include circuit chips or devices, dielectric materials, flexible interconnect layers, and substrates comprising structurally appropriate materials such as ceramics, ceramic composites, plastics, aluminum, and silicon carbide, for example.

Contact metallization 12 may comprise any type of metallization that is present on support layer 10. If support layer 10 is a circuit chip, contact metallization 12 comprises chip pads. If support layer 10 is a patterned, metallized polymer, contact metallization 12 comprises the metallization pattern. If support layer 10 is a substrate, contact metallization 12 comprises substrate metallization.

Dielectric material 14 may comprise any appropriate insulating layer. In one embodiment, dielectric material 14 comprises a laser ablatable material such as a polyimide film and an adhesive material for attaching the laser ablatable material to the support layer. The dielectric material may comprise multiple polymer layers. Vias 16, 18, and 20 with sidewalls 21 are formed in dielectric material 14 to extend to the contact metallization 12.

The invention is expected to be useful regardless of thickness. Particularly useful thicknesses range from about 10 microns to about 150 microns, and a range that is expected to be even more useful is from about 10 microns to about 75 microns. For low dielectric material thicknesses, the present invention is especially useful when substantially vertical sidewalls (having slopes of ranging from about 85° to about 95°) are formed.

The invention is additionally expected to be useful regardless of sidewall slope. Particularly useful slopes range from about seventy degrees (70°) to about one hundred ten degrees (110°) and an even more useful range is from about eighty five degrees (85°) to about ninety five degrees (95°).

In FIG. 1, the vias are shown as having vertical slopes of approximately ninety (90) degrees with via 18 further having recessed portions 19. Example diameters for the vias shown in FIG. 1 are 12.5 micrometers (0.5 mils) for via 20, twenty five micrometers (1 mil) for via 16, and 18.75 micrometers (0.75 mils) for a top diameter of via 18 with a bottom diameter of plus or minus about ten percent to about forty percent of the top via diameter. After via fabrication, residual debris is removed by plasma ashing or RIE, for example. Other cleaning processes such as high pressure spraying or wet chemical etching and rinsing can alternatively be used.

Figure 2:
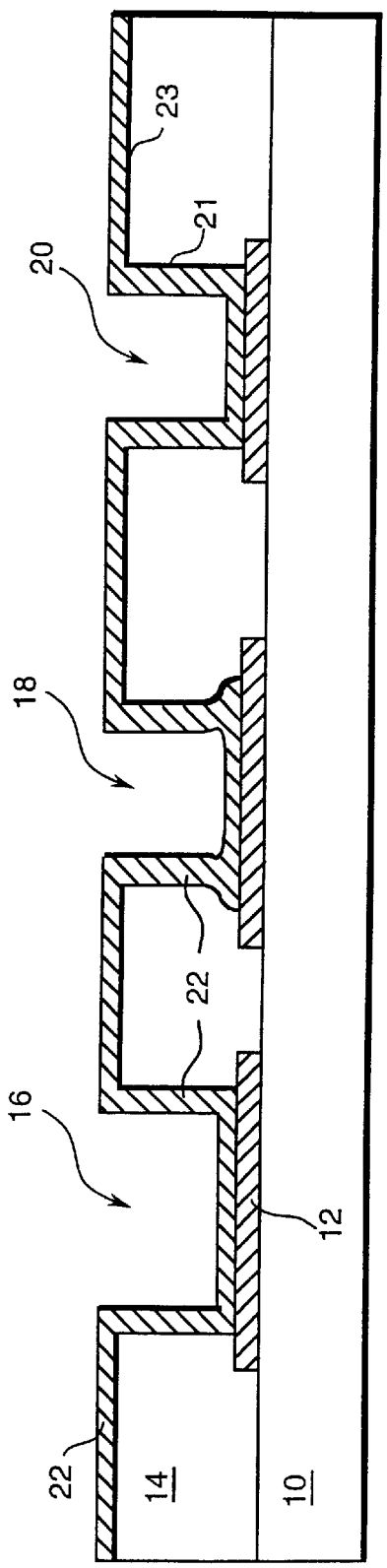
FIG. 2 is a view similar to that of FIG. 1 further illustrating a first seed layer.

FIG. 2 is a view similar to that of FIG. 1 further illustrating a first seed layer 22 applied over a horizontal surface 23 of dielectric material 14, via sidewalls 21, and contact metallization 12. First seed layer 22 comprises a thin layer of a material such as tin chloride or palladium chloride. The thickness of the first seed layer may range from several monomers up to about 100 angstroms, for example.

As described in Foust et al., U.S. Pat. No. 4,999,251, application of the seed layer to the dielectric material can be achieved by well known methods of the art. For example, the dielectric layer can be contacted with an acid solution of a precious metal such as tin chloride or palladium chloride in hydrochloric acid for a period of time sufficient to cause catalytic activation of the substrate surface. Application processes suitable for the present invention are described in more detail, for example, in U.S. Pat. Nos. 3,011,920 and 3,841,881.

As described in Walsh, U.S. Pat. No. 5,015,517, adhesion of the a catalyst (referred to herein as the first seed layer) is increased when, prior to application of the first seed layer, the dielectric material is texturized. In the present invention, if the process of forming the vias includes laser ablation, for example, the sidewalls of the vias become texturized. As further described in Walsh, a hydrophilic (texturized) surface can be catalyzed with any one of the well known catalyst systems. The catalysts may either be applied in a two step application, by first depositing the sensitizer and then the Nobel metal activator or be applied in a combined one step operation such as a black colored tin-palladium colloidal dispersion.

Figure 3:
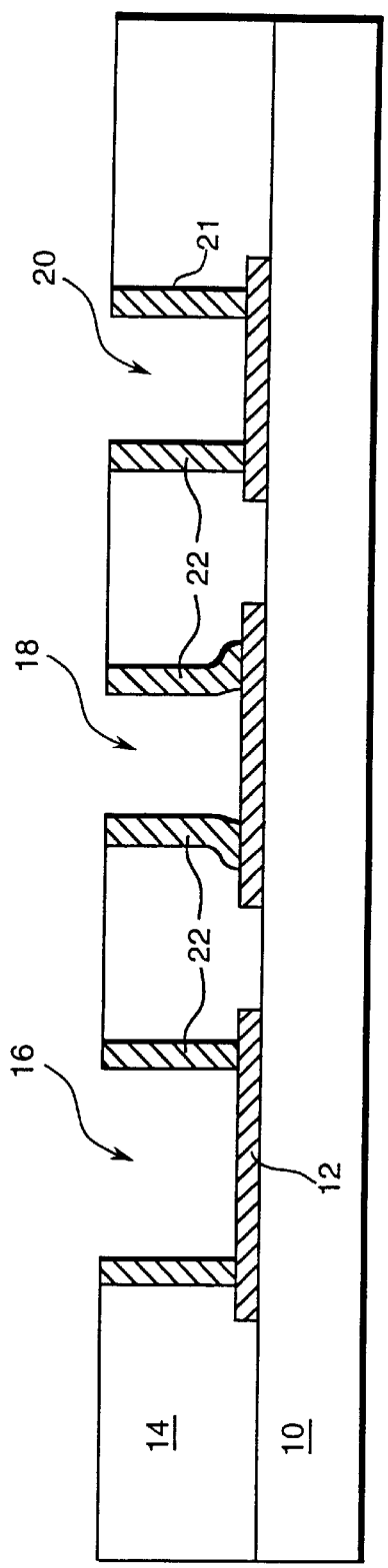
FIG. 3 is a view similar to that of FIG. 2 after a portion of the seed layer has been removed.

FIG. 3 is a view similar to that of FIG. 2 after a portion of the first seed layer has been removed. After application of the first seed layer, the horizontal surfaces of the contact metallization (the bottom surfaces of the vias) and horizontal surface 23 of dielectric material 14 can be backsputtered to remove the first seed layer from these horizontal surfaces while leaving a sufficient portion of the first seed layer on sidewalls 21 of the vias to act as a catalyst for depositing another metal layer on the sidewalls (as is further discussed with respect to FIG. 5 below).

Figure 4:
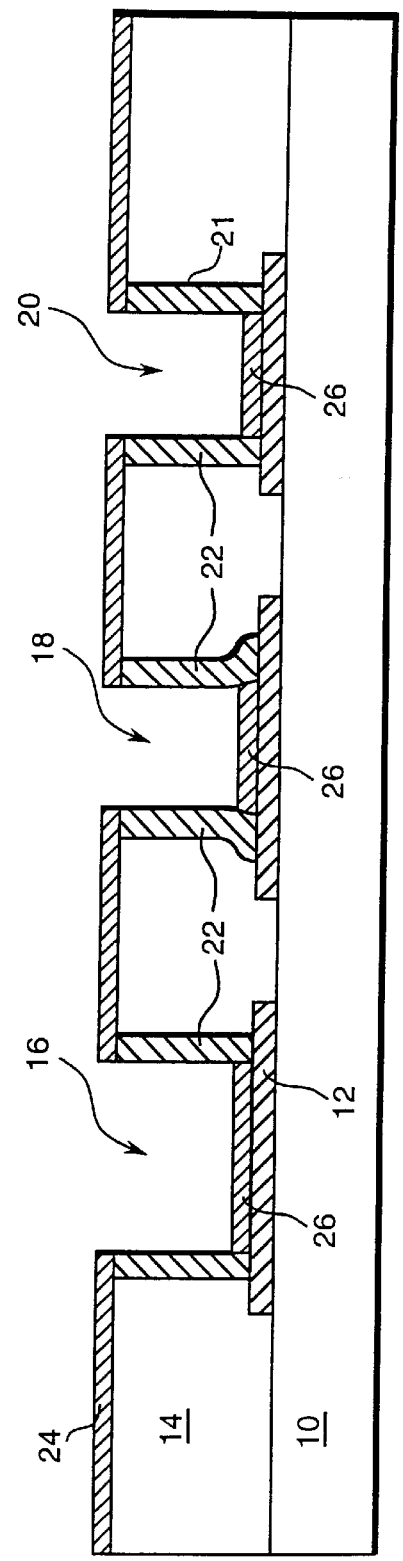
FIG. 4 is a view similar to that of FIG. 3 further illustrating a second seed layer.

FIG. 4 is a view similar to that of FIG. 3 further illustrating a second seed layer comprising portions 24 and 26. In one embodiment, the second seed layer comprises a thin layer of sputtered titanium (to a thickness of about 1000 angstroms) coated by a thin layer of sputtered copper (to a thickness of about 3000 angstroms). When the second seed layer is sputtered, a portion 24 adheres to the dielectric material and portions 26 adhere to the contact metallization, but regions on the sidewalls of the vias receive little or no additional metal coverage In this two step process, optimum adhesion is achieved in both the sidewall area and the surface of the contact metallization. By back sputtering the first seed layer off the contact metallization, the conventional metallurgical interconnect can be achieved by sputter deposition of thin titanium and copper layers as discussed above. If the back sputter process is not used, the loosely held first seed layer on the relatively smooth surface of the dielectric layer would be held by electrostative attraction and be a less reliable contact area for the second seed layer. (As discussed above, natural roughness on the vias sidewalls can help with adhesion of the first seed layer on these surfaces.) Furthermore, depending on the type of metal used for the contact metallization, an oxide layer could form on the contact metallization and result in high resistance electrical interconnections and thus render the circuit non-functional. By using back sputter and sputter deposition steps to interconnect the contact metallization, this problem is circumvented.

Figure 5:
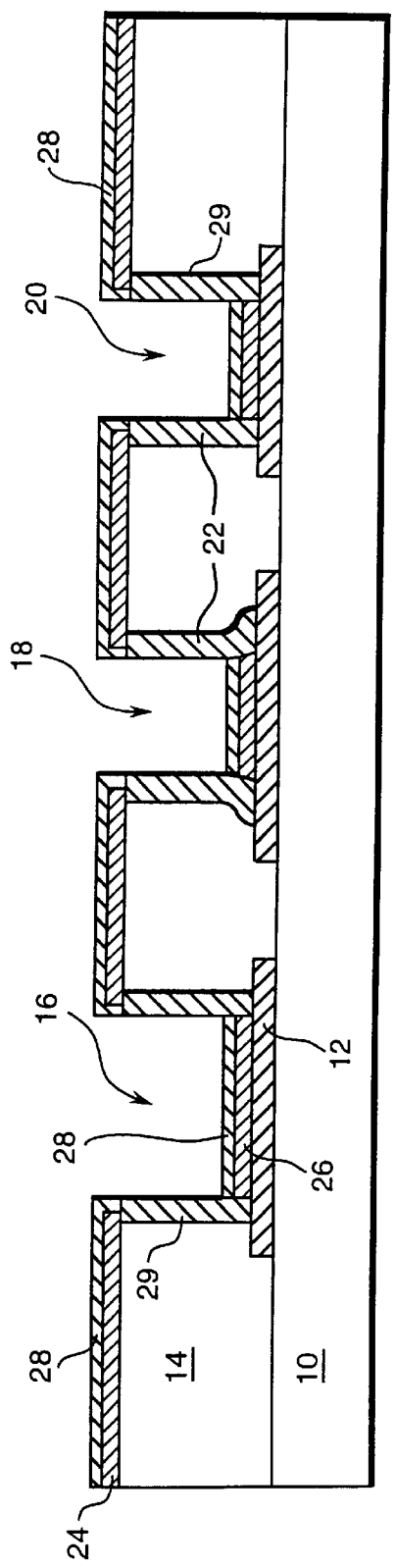
FIG. 5 is a view similar to that of FIG. 4 further illustrating a third seed layer.

FIG. 5 is a view similar to that of FIG. 4 further illustrating third seed layer portions 28 and 29. The third seed layer preferably has a thickness ranging from about one thousand angstroms to about three thousand angstroms.

Figure 7:
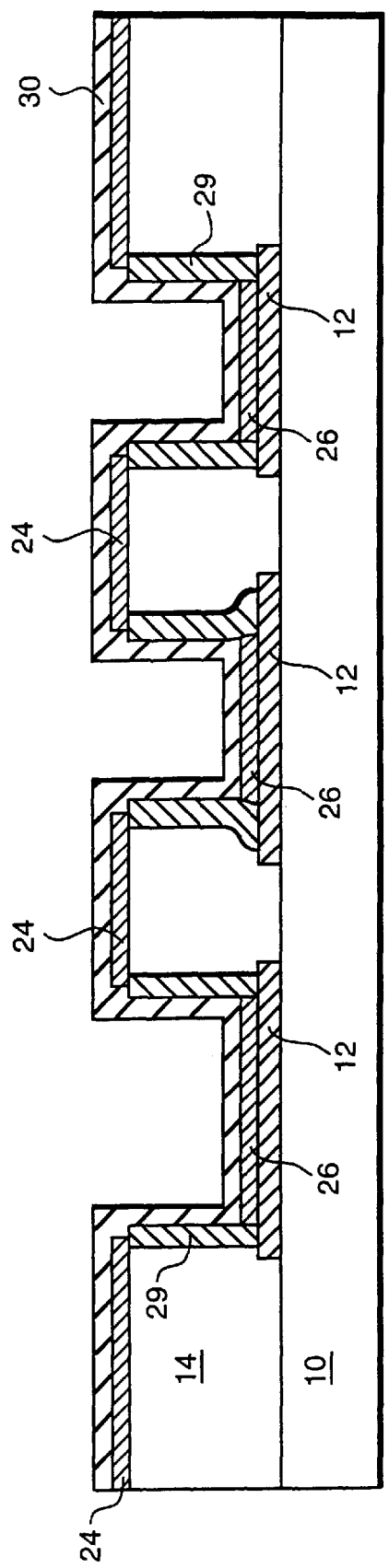
FIG. 7 is a view similar to that of FIG. 6 further illustrating an embodiment wherein the third seed layer is not situated over the second seed layer.

An electroless solution is used to react with the first seed layer and apply the third seed layer 29 over the sidewalls. In one embodiment, third seed layer 29 is applied by immersion in an electroless solution of copper or nickel, for example, which results in a chemical reaction wherein the first seed layer 22 is replaced by the third seed layer 29. In addition to chemically reacting with the first seed layer, depending on the specific electroless bath chemistry, in one embodiment a portion 28 of the third seed layer can be plated on the second seed layer portions 24 and 26. As shown in FIG. 7, in another embodiment, the third seed layer does not adhere to the second seed layer portions 24 and 26.

Figure 6:
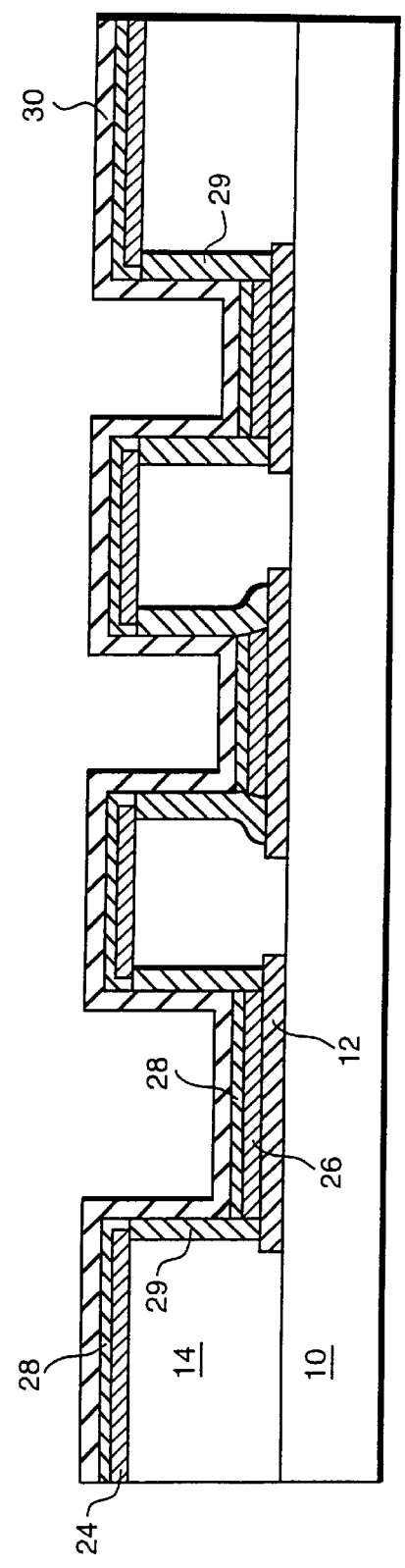
FIG. 6 is a view similar to that of FIG. 5 further illustrating an electroplated layer.

FIG. 6 is a view similar to that of FIG. 5 further illustrating an electroplated layer 30. Electroplated layer 30 can be applied by immersion in an electroplating bath and in one embodiment copper is plated up to a thickness of four (4) micrometers. The combination of second seed layer portions 24 and 26 and the resulting third seed layer 29 provide a ground plane for plating the thicker electroplated layer.

This method of providing metallized vias is of particular use when prefabricated interconnect structures are to be connected using a final HDI interconnection to device pad geometries which are rectangles having sides on the order of seventy five to 125 micrometers (three to five mils) for use with dielectric material on the order of about fifty to seventy five micrometers (2 to about 3 mils) thick.

FIG. 7 is a view similar to that of FIG. 6 further illustrating an embodiment wherein the third seed layer is not situated over the second seed layer.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A structure comprising:
   contact metallization;
   dielectric material having vias having sidewalls and extending through to the contact metallization;
   a seed layer extending over and in physical contact with the via sidewalls;
   a second seed layer extending over and in physical contact with the contact metallization and extending over a horizontal surface of the dielectric material;
   an electroplated layer extending over and in physical contact with the seed layer and the second seed layer.

2. The structure of claim 1 wherein the dielectric material has a thickness ranging from about ten microns to about 150 microns and wherein the via sidewalls have slopes ranging from about seventy degrees to about 110 degrees.

3. The structure of claim 2 wherein the dielectric material has a thickness ranging from about ten microns to about seventy five microns and wherein the via sidewalls have slopes ranging from about eighty five degrees to about 95 degrees.

4. The structure of claim 2 wherein the dielectric material comprises a polyimide, the seed layer comprises tin chloride, the second seed layer comprises titanium coated by copper, and the electroplated layer comprises copper.

5. The structure of claim 2 wherein diameters of the vias range from about 12.5 micrometers to about 25 micrometers.

6. A structure comprising:
   contact metallization;
   dielectric material having vias having steep sidewalls, the vias extending through to the contact metallization;
   a seed layer extending over and in physical contact with the via sidewalls, the seed layer comprising tin chloride or palladium chloride;
   a second seed layer extending over and in physical contact with the contact metallization and extending over a horizontal surface of the dielectric material, the second seed layer comprising titanium coated by copper;
   an electroplated layer extending over and in physical contact with the seed layer and the second seed layer, the electroplated layer comprising copper.

7. A structure comprising:
   contact metallization,
   dielectric material having vias having sidewalls and extending through to the contact metallization;
   a seed layer extending over and in physical contact with the via sidewalls;
   a second seed layer extending over and in physical contact with the contact metallization and extending over a horizontal surface of the dielectric material;
   a third seed layer extending over and in physical contact with the second seed layer; and
   an electroplated layer extending over and in physical contact with the seed layer and the third seed layer.

* * * * *